United States Patent
Jomaa et al.

(10) Patent No.: US 9,398,699 B2
(45) Date of Patent: Jul. 19, 2016

(54) DUAL EPOXY DIELECTRIC AND PHOTOSENSITIVE SOLDER MASK COATINGS, AND PROCESSES OF MAKING SAME

(75) Inventors: Houssam Jomaa, Phoenix, AZ (US); Omar Bchir, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 330 days.

(21) Appl. No.: 13/595,149

(22) Filed: Aug. 27, 2012

(65) Prior Publication Data
US 2012/0318565 A1    Dec. 20, 2012

Related U.S. Application Data

(62) Division of application No. 12/214,700, filed on Jun. 20, 2008, now Pat. No. 8,276,269.

(51) Int. Cl.
| | |
|---|---|
| H05K 1/16 | (2006.01) |
| H05K 3/28 | (2006.01) |
| H01L 21/48 | (2006.01) |
| H01L 23/31 | (2006.01) |
| H01L 23/498 | (2006.01) |
| H01L 21/56 | (2006.01) |
| H01L 23/538 | (2006.01) |
| H05K 1/18 | (2006.01) |
| H05K 3/00 | (2006.01) |
| H05K 3/34 | (2006.01) |

(52) U.S. Cl.
CPC .............. *H05K 3/28* (2013.01); *H01L 21/4853* (2013.01); *H01L 23/3128* (2013.01); *H01L 23/49811* (2013.01); *H01L 21/563* (2013.01); *H01L 23/5387* (2013.01); *H01L 2224/16225* (2013.01); *H01L 2224/16227* (2013.01); *H01L 2224/73204* (2013.01); *H01L 2224/73253* (2013.01); *H01L 2924/01019* (2013.01); *H01L 2924/01046* (2013.01); *H01L 2924/01078* (2013.01); *H01L 2924/01079* (2013.01); *H01L 2924/1433* (2013.01); *H01L 2924/15311* (2013.01); *H05K 1/189* (2013.01); *H05K 3/0035* (2013.01); *H05K 3/3452* (2013.01); *H05K 2201/0162* (2013.01); *H05K 2201/0195* (2013.01); *H05K 2201/0209* (2013.01); *H05K 2201/099* (2013.01); *Y10T 29/4913* (2015.01); *Y10T 29/49128* (2015.01); *Y10T 29/49147* (2015.01); *Y10T 29/49153* (2015.01); *Y10T 29/49165* (2015.01); *Y10T 29/49169* (2015.01)

(58) Field of Classification Search
CPC . H01L 21/027; H01L 21/0271; H01L 21/033; H01L 21/0332; H05K 2201/0133; H05K 2201/09209
USPC .......................... 174/260, 250, 255, 261, 262
See application file for complete search history.

(56) References Cited

U.S. PATENT DOCUMENTS

| | | |
|---|---|---|
| 5,736,456 A | 4/1998 | Akram |
| 5,786,270 A | 7/1998 | Gorrell et al. |
| 6,362,087 B1 | 3/2002 | Wang et al. |

(Continued)

*Primary Examiner* — Tremesha S Willis
(74) *Attorney, Agent, or Firm* — Winkle, PLLC

(57) ABSTRACT

A microelectronic device mounting substrate includes a bond pad with a side wall and an upper surface. A dielectric first layer is disposed on the mounting substrate and a solder mask second layer is disposed on the dielectric first layer. A uniform recess is disposed through the solder mask second layer and the dielectric first layer that exposes the portion of the bond pad upper surface.

14 Claims, 6 Drawing Sheets

(56) References Cited

U.S. PATENT DOCUMENTS

| | | |
|---|---|---|
| 6,593,220 B1 | 7/2003 | Yu et al. |
| 6,642,136 B1 | 11/2003 | Lee et al. |
| 7,973,418 B2 * | 7/2011 | Alvarado ............ H01L 23/3171 257/780 |
| 8,276,269 B2 | 10/2012 | Jomma et al. |
| 2006/0281278 A1 * | 12/2006 | Min .............................. 438/396 |

* cited by examiner

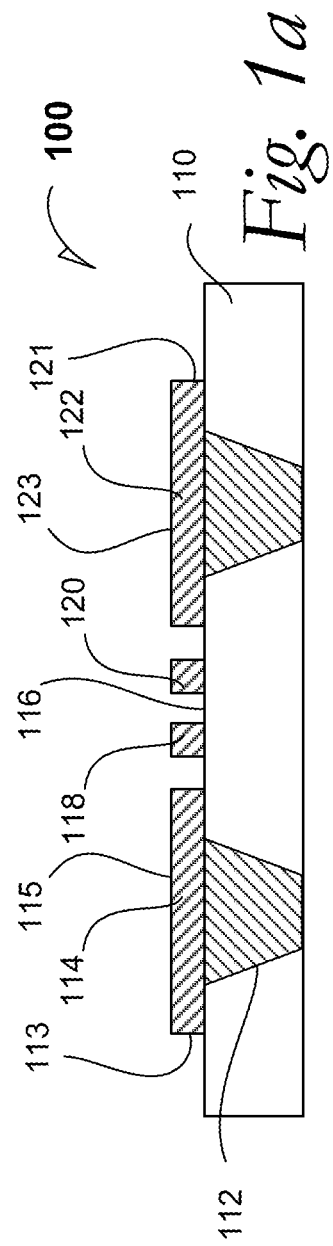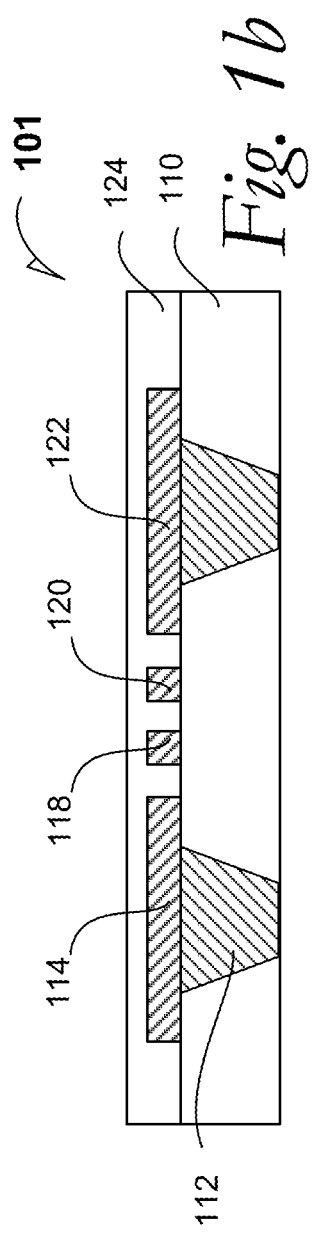

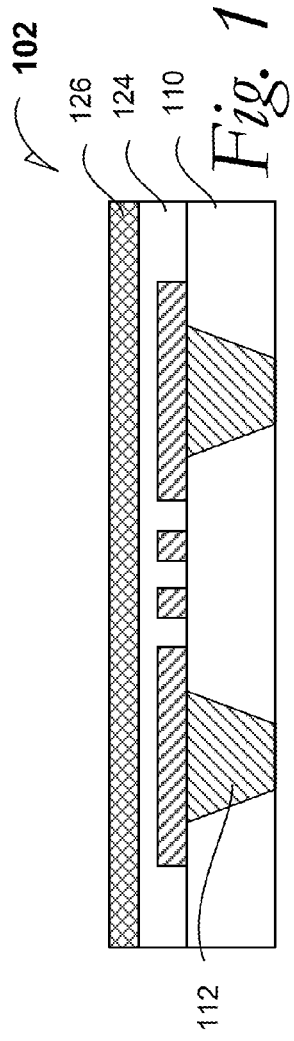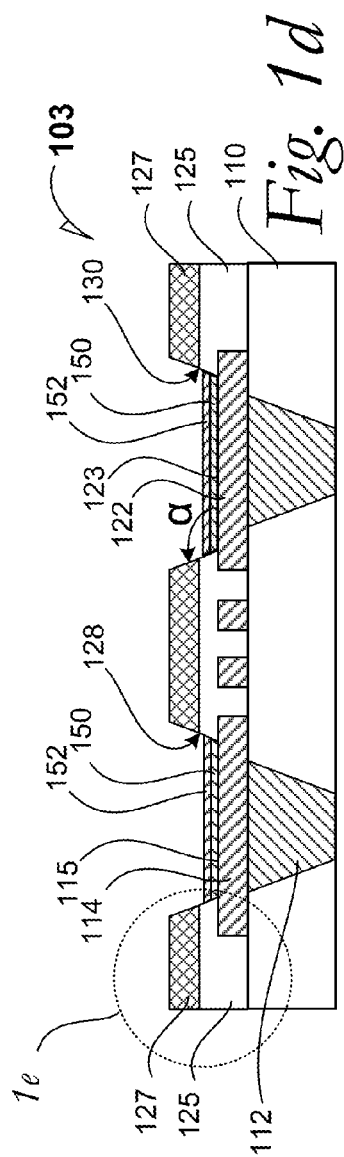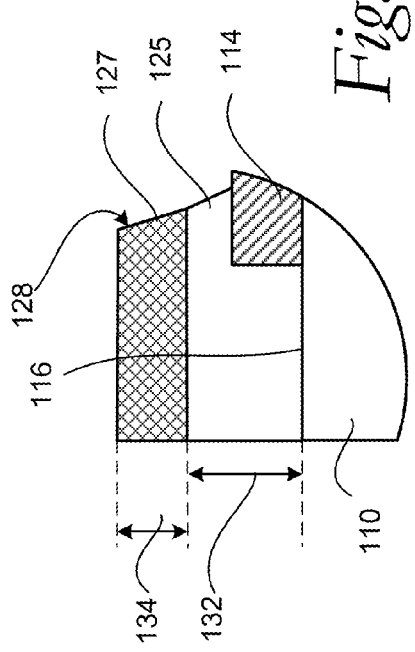

DUAL EPOXY DIELECTRIC AND PHOTOSENSITIVE SOLDER MASK COATINGS, AND PROCESSES OF MAKING SAME

RELATED APPLICATIONS

The present application is a Divisional of U.S. application Ser. No. 12/214,700 filed Jun. 20, 2008, entitled "DUAL EPOXY DIELECTRIC AND PHOTOSENSITIVE SOLDER MASK COATINGS, AND PROCESSES OF MAKING SAME".

TECHNICAL FIELD

Disclosed embodiments relate to semiconductive apparatus, packages, and processes of making them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1a is a cross-section elevation of a section of a microelectronic device package during processing according to an embodiment;

FIG. 1b is a cross-section elevation of a section of the microelectronic device package depicted in FIG. 1a during further processing according to an embodiment;

FIG. 1c is a cross-section elevation of a section of the microelectronic device package depicted in FIG. 1b during further processing according to an embodiment;

FIG. 1d is a cross-section elevation of a section of the microelectronic device package depicted in FIG. 1c during further processing according to an embodiment;

FIG. 1e is a section taken from the drawing depicted in FIG. 1d according to an embodiment;

DETAILED DESCRIPTION

Figure 2:
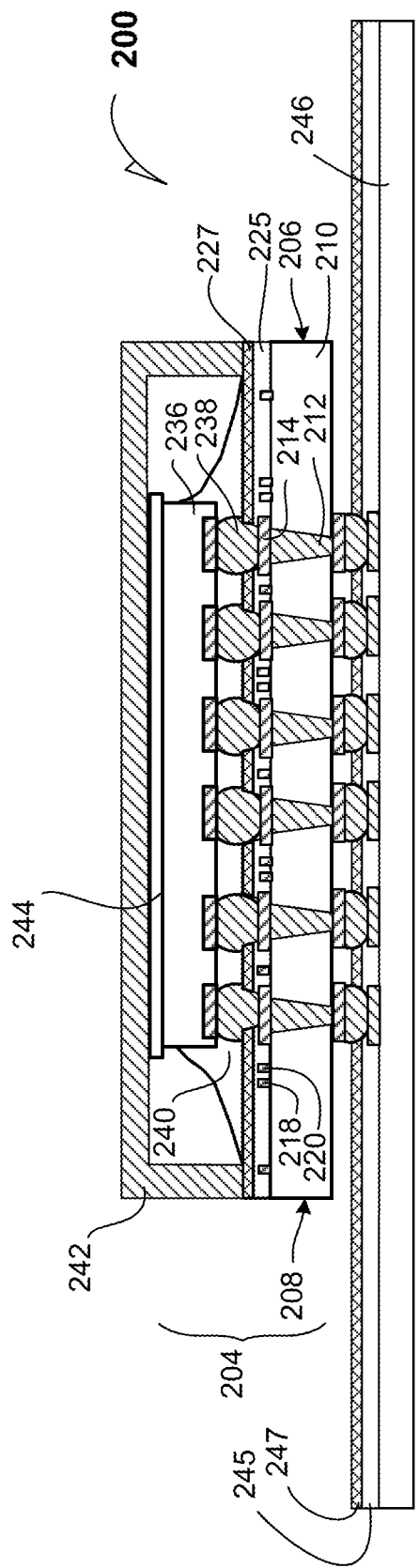
FIG. 2 is a simplified cross section elevation of a microelectronic device apparatus according to an example embodiment.

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings show only the structures necessary to understand the illustrated embodiments. Additional structures known in the art have not been included to maintain the clarity of the drawings.

FIG. 1a is a cross-section elevation of a microelectronic device package 100 during processing according to an embodiment. A mounting substrate 110 is used such as for second-level (meaning, above and adjacent the motherboard) mounting of a microelectronic device such as a semiconductive integrated circuit (IC). In an embodiment, the mounting substrate is a package substrate that includes a core. In an embodiment, the mounting substrate 110 is a laminate with a core layer or multiple buildup dielectric layers with no core. The mounting substrate 110 includes a plurality of filled vias and or plated through holes to form the interconnected structure from the bottom side of the mounting substrate to the top side that enable interfacing the motherboard to the actual semiconducting device, one of which is referenced with numeral 112. The filled via penetrates one dielectric layer that may be on top of another dielectric layer or on top of a substrate core. During processing, the mounting substrate must accommodate bond pads and traces. A first bond pad 114 includes a sidewall 113 and an upper surface 115. The first bond pad 114 is disposed on a mounting substrate upper surface 116. The first bond pad upper surface 115 is to be mated with an electrical connector such as a solder bump, a metal stud, or a solder ball. In an embodiment, the first bond pad upper surface 115 is treated with a surface finish first film 150 such as a nickel-gold, or a nickel-palladium-gold, or an immersion silver, or an immersion tin finish on the upper surface 115, The electrical connector is to be mated to an IC in a flip chip configuration. The layout of the bond pads and traces may be formed by subtractive etching according to an embodiment. Alternatively, the layout of the bond pads and structures may be formed by semi-subtractive process. Alternatively, the layout of the bond pads and traces may be formed by semi-additive processing according to an embodiment. Alternatively, the layout of the bond pads and traces may be formed by sputter processing according to an embodiment.

The package 100 is also illustrated with a first trace 118 and a second trace 120 disposed on the upper surface 116 of the mounting substrate. The first trace 118 and second trace 120 are represented in arbitrary number and locations. The first trace 118 and second trace 120 represent wiring upon the upper surface 116 that is used for routing out the interconnects from the die layer into the mounting substrate.

The package 100 is illustrated with a second bond pad 122 that includes a sidewall 121 and an upper surface 123. The second bond pad 122 is also disposed on the mounting substrate upper surface 116. The second bond pad upper surface 123 is also to be mated with an electrical connector such as a solder bump, a metal stud, or a solder ball. The electrical connector is to be mated to the IC in the flip chip configuration.

FIG. 1b is a cross-section elevation of the microelectronic device package depicted in FIG. 1a during further processing according to an embodiment. The package 101 has been processed with formation of a dielectric first layer 124. The dielectric first layer 124 has been formed on the mounting-substrate upper surface 116, the sidewalls 113 and 121 and the bond-pad upper surfaces 115 and 123 respectively. In an embodiment, the dielectric first layer 124 is deposited using a roll-coating deposition technique. In an embodiment, the dielectric first layer 124 is deposited using a slot-coating deposition technique. In an embodiment, the dielectric first layer 124 is deposited using a dry film lamination technique, followed by a curing process. Other deposition techniques may be used to form the dielectric first layer 124.

In an embodiment, the material of the dielectric first layer 124 is a glass particle filled epoxy based phenol novalac resin or the like In an embodiment, the material of the dielectric first layer 124 is bisbenzocyclobutene based material. In an embodiment, the material of the dielectric first layer 124 is a polyimide material. In an embodiment, the material of the dielectric first layer 124 is a silicone rubber material. In an embodiment, the material of the dielectric first layer 124 is a low dielectric constant (low-k) dielectric material. The choice of the material is influenced by the processing for the underlying substrate such as conductor plating or deposition. The choice of the material is also influenced by overall performance requirements including and not limited to, mechanical and electrical performance.

FIG. 1c is a cross-section elevation of the microelectronic device package depicted in FIG. 1b during further processing according to an embodiment. The package 102 has been processed to form a solder mask second layer 126 above and on the dielectric first layer 124. In an embodiment the solder mask 126 is a material that includes a resin and that is a photoresist material. The solder mask 126 has electrical insulating qualities and also has a function of preventing adhesion of solder or surface finish plating. In an embodiment, the solder mask 126 is an acrylate based material. Acrylate materials or other photoactive based material may generally absorb water moisture or ionic materials from flux or any other surface application during processing or assembly that can lead to reduced component life for electrochemical migration in the traces and other structures such as fine-pitch structures.

In an embodiment, the upper surfaces 115 and 123 may be coated with a surface finish after a laser drilling process to form a recess. For example, the first and second bond pads 114 and 122 may be copper metal, and a surface finish first layer 150 may be a nickel-gold, or a nickel-palladium-gold, or an immersion silver, or an immersion tin finish layer. A surface finish second layer 152 may be a more noble metal such as gold, or nickel gold.

By locating the dielectric first layer 124 beneath the solder mask 126 and as used in mounting-substrate applications, the likelihood of electrochemical migration is lessened. By locating the dielectric first layer 124 beneath the solder mask 126 and as used in mounting-substrate applications, the ability of the package 102 to improve resistance to moisture encroachment during highly accelerated stress testing (HAST) of the package 102 when it is finished.

FIG. 1d is a cross-section elevation of the microelectronic device package depicted in FIG. 1c during further processing according to an embodiment. The package 103 has been processed by laser drilling (laser ablation) simultaneously through both the solder mask second layer 126 and the dielectric first layer 124. After the laser-drilling process, the surface finish layers may be formed in the resulting recesses.

The solder mask second layer 126 and the dielectric first layer 124 (FIG. 1c) are hereinafter referred to as the solder mask layer 127 and the dielectric first layer 125. During processing above the first bond pad 114 and the second bond pad 122, respective first- and second recesses 128 and 130 are formed by the laser-drilling process. In an embodiment, the laser-drilling process forms the recesses 128 and 130 such that a non-orthogonal sidewall may be formed, as illustrated by the sidewall pitch angle α. The sidewall pitch angle, α is represented as an obtuse angle. In an embodiment, the sidewall pitch angle, α, may or may not be orthogonal by using a specific laser and selected conditions.

FIG. 1d illustrates the first recess 128 exposes a portion of the first bond pad upper surface 115, but not all according to an embodiment. Similarly, the second recess 130 exposes a portion of the second bond pad upper surface 123, but not all according to an embodiment. In an embodiment, the relative size of the several recesses may vary depending upon location thereof. For example, the first recess 128 may be nearer the center of a mounting substrate and the second recess 130 may be nearer the edge of the mounting substrate. A second recess 130 that is larger than a first recess 128 may be able to absorb thermal and physical shock better than the first recess 128 during fabrication of the package and during use.

In a process embodiment, either of the first recess 128 or the second recess 130 is referred to as a uniform recess to the effect of laser drilling simultaneously through the dielectric first layer 124 and the solder mask second layer 126. A "uniform recess" can be detected by reproducing a laser ablation process that simultaneously penetrates a dielectric first layer and a solder mask second layer to form a recess such as the first recess 128 or the second recess 130.

In a process embodiment, the solder mask second layer 127 is roughened to assist in a more useful adhesion of an underfill material which may be used for encapsulating the die—or mold material which may be used for the same. The roughening of the solder resist may be accomplished by ashing, plasma treatment of wet chemical desmear which simultaneously prepares the surface of the solder resist for the assembly process and cleans any residue from the laser drilling in the openings formed in the previous process. In a process embodiment, roughening is carried out by desmearing the solder mask second layer 127. In a process embodiment, roughening is carried out by plasma cleaning the solder mask second layer 127.

FIG. 1e is a section taken from the drawing depicted in FIG. 1d according to an embodiment. The mounting substrate 110 is depicted with the dielectric first layer 125 and the solder mask second layer 127 along with the first recess 128. Further, a portion of the first bond pad 114 is also depicted. In an embodiment, the sidewall pitch angle α that results may be indicative of the laser ablative conditions such as laser intensity, size, and duration.

In an embodiment, the dielectric first layer 125 is any of the materials set forth in this disclosure and it has a height 132 in a range from 6 micrometer (μm) to 12 μm above the upper surface 115. In an embodiment, the dielectric first layer 125 has a height 132 that includes 10 μm above the upper surface 115. In an embodiment, the solder mask second layer 127 is any of the materials set forth in this disclosure and it has a height 134 that includes a range from 8 μm to 14 μm. In an embodiment, the solder mask second layer 127 has a height 134 in a range from 10 μm to 12 μm. In an embodiment, the dielectric first layer 125 has a height 132 of 10 μm above the upper surface 115, and the solder mask second layer 127 has a height 134 in a range from 10 μm to 12 μm. In an embodiment, the dielectric first layer 125 has a height 132 that includes 10 μm above the upper surface 115 and, and the solder mask second layer 127 has a height 134 in a range from 10 μm to 12 μm and is an acrylate material. The dielectric first layer 125 exposes a portion of the first bond pad 114. The total thickness and the allocation of the thickness for dielectric and solder mask is selected by designed overall thickness and tolerances of the coating or lamination processes.

Laser ablation (laser drilling) may cause different sidewall pitch angles for each of the dielectric first layer 125 and the solder mask second layer 127 due to the different materials of the dielectric first layer 126 and the solder mask second layer 126. For example, the dielectric first layer 125 may have a sidewall pitch angle β and the solder mask second layer 127 may have a sidewall pitch angle γ. The average of the sidewall pitch angle β and the solder mask second layer 127 may be referred to as the sidewall pitch angle α.

FIG. 2 is a cross section elevation of a microelectronic device apparatus 200 according to an example embodiment. A mounting substrate 210 is used for second-level mounting of a microelectronic device 236 such as a semiconductive IC. The mounting substrate 210 includes a plurality of filled vias, one of which is referenced with numeral 212. The filled via 212 penetrates the substrate 210. A first bond pad 214 is disposed on the mounting substrate 210. The first bond pad 214 is mated with an electrical connector 238 such as a solder bump, a metal stud, or a solder ball. The electrical connector 238 is mated to the microelectronic IC 236 in a flip chip configuration. The mounting substrate 210 has been processed by laser drilling simultaneously through both a solder mask second layer 227 and a dielectric first layer 225 according to a process embodiment. The solder mask second layer 227 and the dielectric first layer 225 are analogous to the solder mask second layer 127 and the dielectric first layer 125 depicted in FIG. 1d. The mounting substrate 210, the IC 236, and structures encompassed by the bracket 204 may be referred to as a chip package 204.

The chip package 204 is also illustrated with a first trace 218 and a second trace 220 disposed on the mounting substrate 210. The first trace 218 and second trace 220 are represented in arbitrary number and locations. The first trace 218 and second trace 220 represent wiring upon the mounting substrate 210 for second-level routing applications.

In an embodiment, the mounting substrate 210 includes a first edge 206 and a second edge 208, which are the part of the perimeter of the mounting substrate 210 as illustrated. Consequently in this embodiment, the solder mask second layer 227 and the dielectric first layer 225 are each present at the respective first edge 206 and second edge 208.

In a process embodiment, a die-attachment phase attaches the IC 236 to the mounting substrate 210. The mounting substrate 210 material depends on the packaging type, but in any event the solder mask second layer 227 and the dielectric first layer 225 are present.

In a process embodiment, the IC 236 and the mounting substrate 210 are processed in an encapsulation phase to encapsulate the IC 236 to the mounting substrate 210. Underfill material 240 may be dispensed between the IC 236 and the mounting substrate 210. In an embodiment, an integrated heat spreader 242 (IHS) may be attached to the IC 236 and mounting substrate 210. In an embodiment, the IHS 242 is thermally coupled to the IC 236 through a thermal interface material (TIM) 244 such as a thermal grease. In an embodiment, the IHS 242 is thermally coupled to the IC 236 through a thermal interface material (TIM) 244 such as a polymer-solder hybrid. In an embodiment, the IHS 242 is thermally coupled to the IC 236 through a TIM 244 such as an indium-containing reactive solder.

The IHS 242 may be referred to as a lid that is part of a larger IHS system to which a heat sink may be attached. In an embodiment, the encapsulated assembly of the IC 236 and mounting substrate 210 with the accompanying structures becomes a package ready to be tested.

In a process embodiment, a stress testing phase performs one or more tests such as Highly Accelerated Stress Test (HAST) or biased-HAST on the device package under stress conditions. A test chamber may be designed to conduct a stress test. It may have monitoring circuits, measurement circuits, and other data processing equipment. The chip package 204 is placed in the test chamber subject to the stress test. It may be powered or non-powered. Various stress tests may be performed on the wafer or on the chip package at various stages of the manufacturing process flow. The tests may follow standards such as Joint Electron Device Engineering Council (JEDEC) standards or military standards. Examples of these tests may include electrostatic discharge (ESD), or human body model (HBM), high temperature operational life (HTOL), thermal shock, temperature cycle, high temperature storage, vibration and mechanical loading, shear testing, and accelerated moisture resistance that simulates prolonged real life usage and reliability.

The flip-chip package 204 is depicted as being mated with a board 246 such as a printed wiring board according to an embodiment. In an embodiment, the board 246 may also be prepared with a dielectric first layer 245 that opposes the mounting substrate 210 and a solder mask second layer 247 disposed on the board dielectric first layer 245. The materials of the dielectric first layer 245 and solder mask second layer 247 may be made of materials similar to the respective solder mask second layer 227 and dielectric first layer 225.

Figure 3:
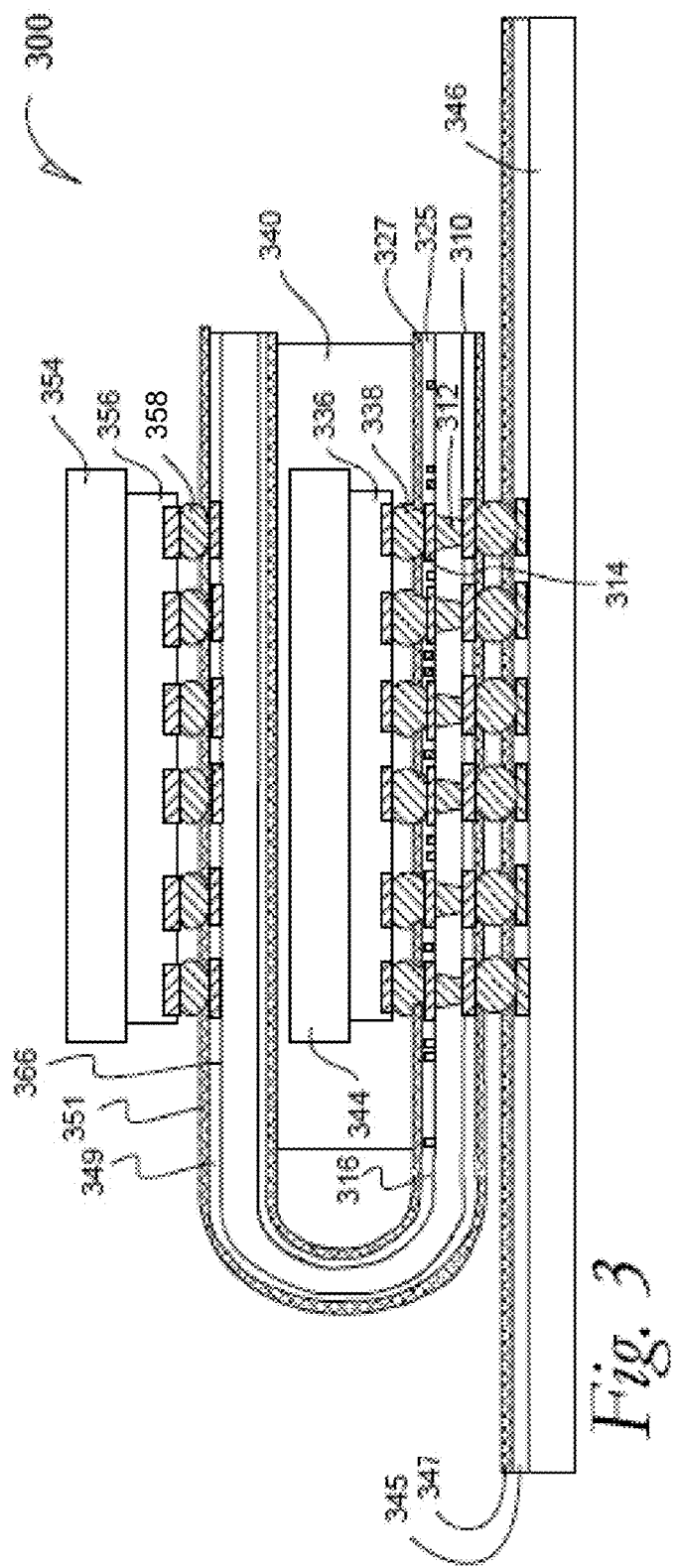
FIG. 3 is a simplified cross section elevation of a microelectronic device apparatus according to an example embodiment.

FIG. 3 is a cross section elevation of a microelectronic device apparatus 300 according to an example embodiment. A folded flexible (folded flex) mounting substrate 310 is used for second-level mounting of a microelectronic device 336 such as a semiconductive IC. The folded flex mounting substrate 310 includes a plurality of filled vias, one of which is referenced with numeral 312. The filled via 312 penetrates the folded flex mounting substrate 310. A first bond pad 314 is disposed on the folded flex mounting substrate 310 that includes a folded flex mounting substrate upper surface 316 and a folded flex mounting substrate upper surface 316. The first bond pad 314 is mated with an electrical connector 338 such as a solder bump, a metal stud, or a solder ball. The electrical connector 338 is mated to the microelectronic IC 336 in a flip chip configuration. The folded flex mounting substrate 310 has been processed by laser drilling simultaneously through both a solder mask upper second layer 327 and a dielectric upper first layer 325 according to a process embodiment. The solder mask second layer 327 and the dielectric first layer 325 are analogous to the solder mask second layer 127 and the dielectric first layer 125 depicted in FIG. 1d.

In a process embodiment, a die-attachment phase attaches the IC 336 to the folded flex mounting substrate 310. The folded flex mounting substrate 310 material depends on the packaging type, but in any event the solder mask second layer 327 and the dielectric first layer 325 are present.

In a process embodiment, the IC 336 and the folded flex mounting substrate 310 are processed in an encapsulation phase to encapsulate the IC 336 to the folded flex mounting substrate 310. Encapsulation material 340 may be dispensed between the IC 336 and the folded flex mounting substrate 310. In an embodiment, a heat slug 344 may be attached to the IC 336 and folded flex mounting substrate 310.

A second IC 356 may be mounting on the folded flex mounting substrate 310 at a folded flex mounting substrate lower surface 366. The second IC 356 may be coupled to the folded flex mounting substrate 310 by an electrical connector 358 that penetrates a dielectric lower first layer 349 and a solder mask lower second layer 351 that are likewise processed similarly to the dielectric upper first layer 325 and the solder mask upper second layer 327. A heat slug 354 may be mounted on the second IC 356. Alternatively an IHS with a TIM may take the place of the heat slug similarly to the IHS 242, the TIM 244, and the underfill material 240.

The folded flex mounting substrate 310 is depicted as being mated with a board 346 such as a printed wiring board according to an embodiment. In an embodiment, the board 346 may also be prepared with a dielectric first layer 345 and a solder mask second layer 347 similarly to the solder mask second layer 227 and the dielectric first layer 225.

Figure 4:
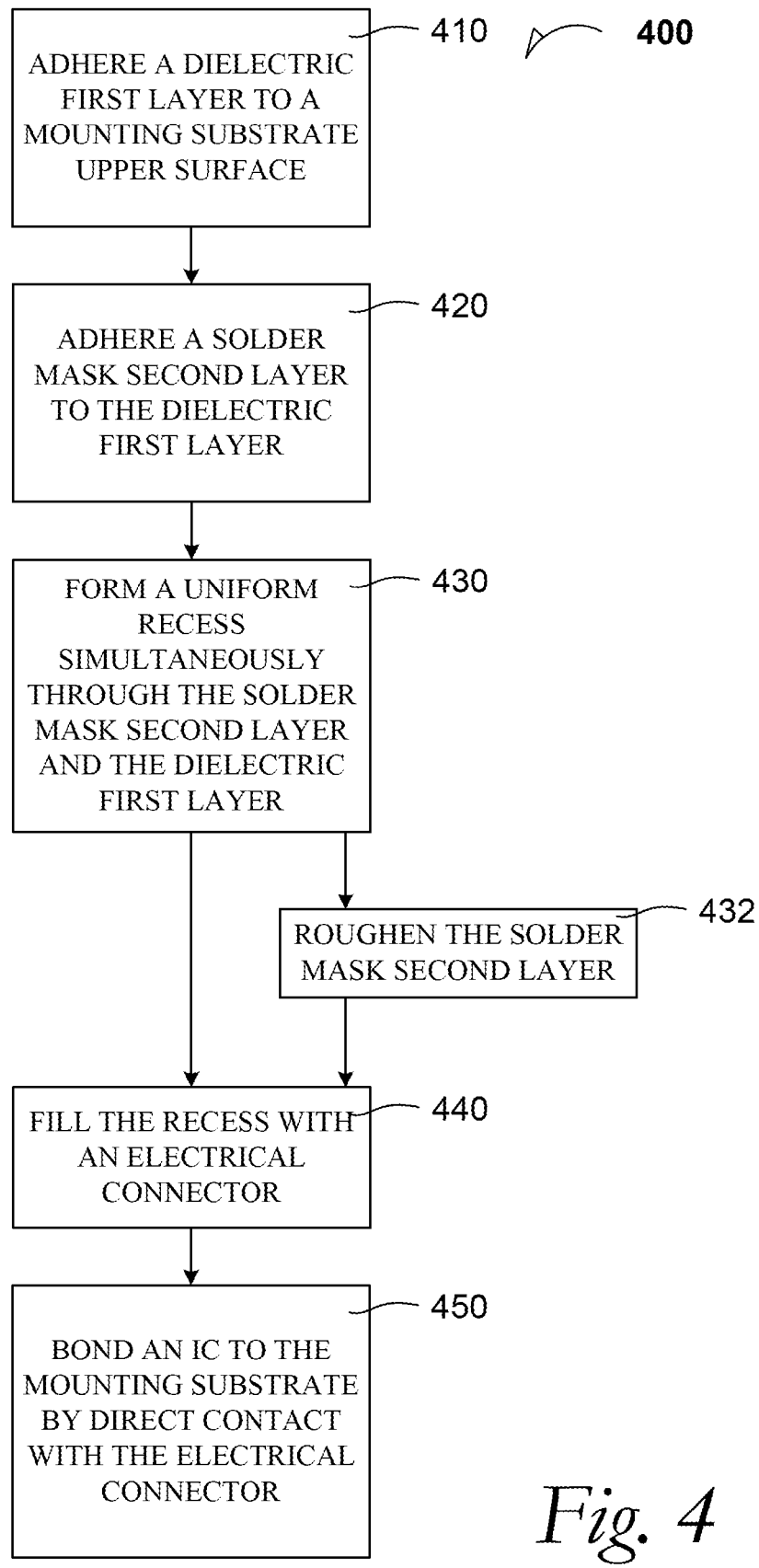
FIG. 4 is a method flow diagram 400 according to an embodiment.

FIG. 4 is a process flow diagram 400 according to an embodiment.

At 410, the process includes adhering a dielectric first layer to a mounting substrate upper surface.

At 420, the process includes adhering a solder mask second layer to the dielectric first layer.

At 430, the process includes forming a uniform recess simultaneously through the solder mask second layer and the dielectric first layer. In an embodiment, the process commences at 410 and terminates at 430.

At 432, the process includes roughening the solder mask second layer.

At 440, the process includes filling the recess with an electrical connector. In a non-limiting example embodiment, filling the recess is preceded with forming a surface finish film on the upper surface of a bond pad that is exposed by the uniform recess.

At 450, the process includes bonding an IC to the mounting substrate by direct contact with the electrical connector.

Figure 5:
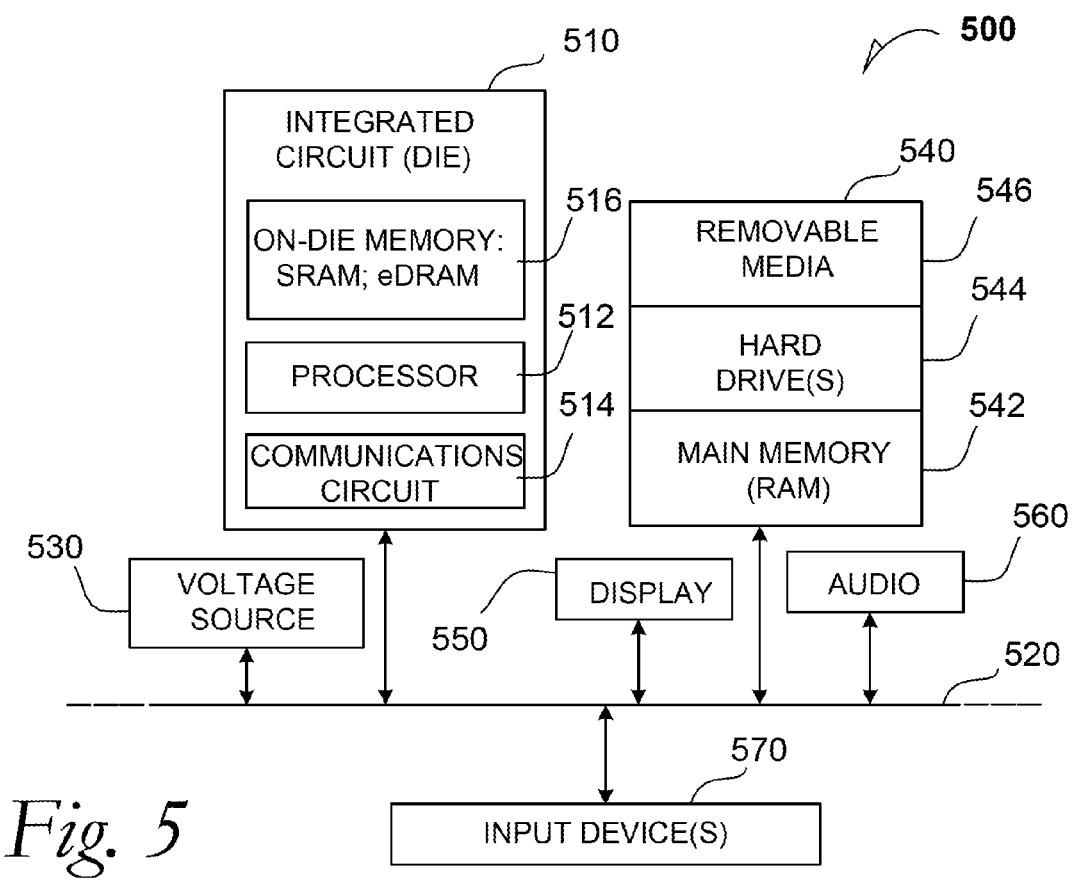
FIG. 5 is a schematic of an electronic system according to an embodiment.

FIG. 5 is a schematic of an electronic system 500 according to an embodiment. The electronic system 500 as depicted can embody a mounting substrate or an apparatus with a uniform recess that is formed through a solder mask second layer and a dielectric first layer as set forth in this disclosure. In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. Other types of circuits that can be included in the integrated circuit 510 are a custom circuit or an ASIC, such as a communications circuit 514 for use in wireless devices such as cellular telephones, pagers, portable computers, two-way radios, and similar electronic systems. In an embodiment, the processor 510 includes on-die memory 516 such as SRAM. In an embodiment, the processor 510 includes on-die memory 516 such as eDRAM.

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital video disks (DVDs), flash memory keys, and other removable media known in the art.

In an embodiment, the electronic system 500 also includes a display device 550, an audio output 560. In an embodiment, the electronic system 500 includes a controller 570, such as a keyboard, mouse, trackball, game controller, microphone, voice-recognition device, or any other device that inputs information into the electronic system 500.

As shown herein, the integrated circuit 510 can be implemented in a number of different embodiments, including an electronic package with a mounting substrate or an apparatus with a uniform recess that is formed through a solder mask second layer and a dielectric first layer, an electronic system, a computer system, one or more methods of fabricating an integrated circuit, and one or more methods of fabricating an electronic assembly that includes a mounting substrate or an apparatus with a uniform recess that is formed through a solder mask second layer and a dielectric first layer as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus comprising:
   a microelectronic device mounting substrate that includes a bond pad with a side wall thereof and an upper surface thereof;
   a dielectric first layer disposed on the microelectronic device mounting substrate, wherein the dielectric first layer abuts the bond pad side wall and a portion of the bond pad upper surface;
   a solder mask second layer disposed on the dielectric first layer;
   a uniform recess through the solder mask second layer and the dielectric first layer that exposes the portion of the bond pad upper surface, wherein the uniform recess comprises the dielectric first layer having a sidewall that has a pitch angle and the solder mask second layer having a sidewall that has a pitch angle, wherein the sidewall of the solder mask second layer extends completely through the solder mask second layer to the sidewall of the dielectric first layer, wherein the sidewall of the dielectric first layer extends from the sidewall of the solder mask second layer to the bond pad upper surface, and wherein the sidewall pitch angle of the dielectric first layer differs from the sidewall pitch angle of the solder mask second layer;
   an electrical connection disposed in the recess and in physical contact with the sidewall of the dielectric first layer and with the sidewall of the solder mask second layer, and in electrical contact with the bond pad; and
   a microelectronic device including an active surface, wherein the active surface faces the bond pad upper surface, and wherein the active surface is bonded to the electrical connection.

2. The apparatus of claim 1, wherein the dielectric first layer includes a glass-particle filled epoxy resin.

3. The apparatus of claim 1, wherein the dielectric first layer includes a bisbenzocyclobenzene material.

4. The apparatus of claim 1, wherein the dielectric first layer includes a polyimide material.

5. The apparatus of claim 1, wherein the dielectric first layer includes a silicone rubber material.

6. The apparatus of claim 1, wherein the dielectric first layer includes a low dielectric constant material.

7. The apparatus of claim 1, wherein the dielectric first layer includes a interpenetrating polymer network material.

8. The apparatus of claim 1, wherein the mounting substrate includes a first edge and a second edge opposite the first edge, and wherein each of the dielectric first layer and the solder mask second layer extend to the respective first and second edges.

9. The apparatus of claim 1, wherein the mounting substrate is disposed on a board.

10. The apparatus of claim 9, wherein the board includes a board dielectric first layer that opposes the mounting substrate and a board solder mask second layer disposed on the board dielectric first layer.

11. The apparatus of claim 1, wherein the dielectric first layer is a dielectric upper first layer disposed on an upper surface of the mounting substrate, wherein the mounting substrate is a folded flexible mounting substrate including the upper surface and a lower surface.

12. The apparatus of claim 11, wherein the folded flex mounting substrate includes a lower surface with a dielectric lower first layer disposed thereon and a solder mask lower second layer disposed on the dielectric lower first layer.

13. A computing system comprising:
a microelectronic die;
a microelectronic device mounting substrate that includes a bond pad with a side wall thereof and an upper surface thereof;
a dielectric first layer disposed on the microelectronic device mounting substrate, wherein the dielectric first layer abuts the bond pad side wall and a portion of the bond pad upper surface;
a solder mask second layer disposed on the dielectric first layer;
a uniform recess through the solder mask second layer and the dielectric first layer that exposes the portion of the bond pad upper surface, wherein the uniform recess comprises the dielectric first layer having a sidewall that has a pitch angle and the solder mask second layer having a sidewall that has a pitch angle, wherein the sidewall of the solder mask second layer extends completely through the solder mask second layer to the sidewall of the dielectric first layer, wherein the sidewall of the dielectric first layer extends from the sidewall of the solder mask second layer to the bond pad upper surface, and wherein the sidewall pitch angle of the dielectric first layer differs from the sidewall pitch angle of the solder mask second layer;
an electrical connection disposed in the recess and in physical contact with the sidewall of the dielectric first layer and with the sidewall of the solder mask second layer, and in electrical contact with the bond pad, and wherein the electrical connection couples the microelectronic die to the mounting substrate; and
external memory coupled to the microelectronic die.

14. The computing system of claim 13, wherein the computing system is part of one of a cellular telephone, a pager, a portable computer, a desktop computer, and a two-way radio.

* * * * *